United States Patent
Yang et al.

(10) Patent No.: US 12,094,267 B1
(45) Date of Patent: Sep. 17, 2024

(54) VARIABLE MULTIPLEXER FOR VEHICLE COMMUNICATION BUS COMPATIBILITY

(71) Applicant: Samsara Inc., San Francisco, CA (US)

(72) Inventors: Xin Yang, Oakland, CA (US); Justin Tingao Xiao, San Francisco, CA (US); Harrison Riley Davis, Oakland, CA (US)

(73) Assignee: Samsara Inc., San Francisco, CA (US)

( * ) Notice: Subject to any disclaimer, the term of this patent is extended or adjusted under 35 U.S.C. 154(b) by 0 days.

(21) Appl. No.: 18/447,860

(22) Filed: Aug. 10, 2023

Related U.S. Application Data

(63) Continuation of application No. 16/985,649, filed on Aug. 5, 2020, now Pat. No. 11,776,328.

(51) Int. Cl.
| | |
|---|---|
| *G07C 5/08* | (2006.01) |
| *G07C 5/00* | (2006.01) |
| *H03M 13/09* | (2006.01) |
| *H04L 12/40* | (2006.01) |
| *H04L 67/12* | (2022.01) |

(52) U.S. Cl.
CPC ........... *G07C 5/0808* (2013.01); *G07C 5/008* (2013.01); *H03M 13/096* (2013.01); *H04L 12/40* (2013.01); *H04L 67/12* (2013.01); *G07C 2205/02* (2013.01); *H04L 2012/40215* (2013.01); *H04L 2012/40273* (2013.01)

(58) Field of Classification Search
CPC .. G07C 5/0808; G07C 5/008; G07C 2205/02; H03M 13/096; H04L 12/40; H04L 67/12; H04L 2012/40215; H04L 2012/40273
See application file for complete search history.

(56) References Cited

U.S. PATENT DOCUMENTS

| | | |
|---|---|---|
| 7,038,485 B2 | 5/2006 | Nakashima et al. |
| 8,015,445 B2 | 9/2011 | Ando |
| 8,638,838 B1 | 1/2014 | Betts et al. |
| 9,471,528 B2 | 10/2016 | Muth |
| 9,568,533 B2 | 2/2017 | Jiang et al. |
| 9,678,131 B2 | 6/2017 | Jiang et al. |
| 9,678,847 B2 | 6/2017 | Du et al. |
| 9,960,930 B2 | 5/2018 | Riedel |
| 10,425,361 B2 | 9/2019 | Daugherty, III |
| 10,574,553 B2 | 2/2020 | Du et al. |

(Continued)

OTHER PUBLICATIONS

"U.S. Appl. No. 16/943,652, Non Final Office Action mailed Nov. 4, 2021", 13 pgs.

(Continued)

*Primary Examiner* — Michael V Kerrigan
(74) *Attorney, Agent, or Firm* — Schwegman Lundberg & Woessner, P.A.

(57) ABSTRACT

Disclosed are systems, methods, and non-transitory computer-readable media for a variable multiplexer for vehicle communication bus compatibility. A device includes a variable multiplexer that can be electronically configured to a desired pinout configuration to provide compatibility with multiple vehicles. For example, the variable multiplexer may be electronically configured based on a pinout configuration used by the vehicle to connect pins in the device to the corresponding pins on the data link connector that provide the same specified function. The device may therefore use a single standardized cable with vehicles using a variety of pinout configurations.

20 Claims, 9 Drawing Sheets

(56) References Cited

U.S. PATENT DOCUMENTS

| | | |
|---|---|---|
| 10,800,363 B2 | 10/2020 | Du et al. |
| 11,310,069 B2 | 4/2022 | Xiao et al. |
| 2011/0252284 A1 | 10/2011 | Sindhu et al. |
| 2018/0225891 A1 | 8/2018 | Lambourne et al. |
| 2021/0094582 A1* | 4/2021 | Lee ..................... G11B 27/031 |
| 2021/0184328 A1 | 6/2021 | Seki et al. |
| 2022/0038301 A1 | 2/2022 | Xiao et al. |
| 2022/0044500 A1 | 2/2022 | Yang et al. |

OTHER PUBLICATIONS

"U.S. Appl. No. 16/943,652, Notice of Allowance mailed Dec. 17, 2021", 9 pgs.

"U.S. Appl. No. 16/943,652, Response filed Nov. 19, 2021 to Non Final Office Action mailed Nov. 4, 2021", 10 pgs.

"U.S. Appl. No. 16/985,649, Non Final Office Action mailed Jan. 19, 2023", 11 pgs.

"U.S. Appl. No. 16/985,649, Notice of Allowance mailed May 17, 2023", 8 pgs.

"U.S. Appl. No. 16/985,649, Response filed Apr. 19, 2023 to Non Final Office Action mailed Jan. 19, 2023", 12 pgs.

"U.S. Appl. No. 17/654,934, Non Final Office Action mailed Dec. 5, 2022".

"U.S. Appl. No. 17/654,934, Notice of Allowance mailed Apr. 3, 2023", 8 pgs.

"U.S. Appl. No. 17/654,934, Preliminary Amendment filed Apr. 6, 2022", 8 pgs.

"U.S. Appl. No. 17/654,934, Response filed Feb. 15, 2023 to Non Final Office Action mailed Dec. 5, 2022".

\* cited by examiner

VARIABLE MULTIPLEXER FOR VEHICLE COMMUNICATION BUS COMPATIBILITY

PRIORITY APPLICATION

This application claims priority to U.S. patent application Ser. No. 16/985,649, filed on Aug. 5, 2020, the disclosure of which is incorporated by reference herein in its entirety.

TECHNICAL FIELD

Embodiments of the present subject matter relate generally to vehicles and, more specifically, to a variable multiplexer for vehicle communication bus compatibility.

BACKGROUND

Modern vehicles are equipped to provide many computer managed features. For example, vehicles include computers, sensors, and actuators that monitor and/or control engine emissions, tire pressure, anti-lock brakes, climate systems, automated driving, and the like. These devices communicate with each other using a bus standard, such as CAN bus, that allows microcontrollers and electronic devices to communicate with fast and reliable data transfer in electrically noisy environments with minimal wiring. Many vehicles include a port that allows external accessory devices to be connected to the CAN bus of the vehicle to communicate with the various computers, sensors, and/or actuators connected to the CAN bus. For example, vehicles often include a diagnostic port that allows for diagnostic tools to interface with the CAN bus by transmitting commands, reading data, and the like. While the many vehicle manufacturers use a standardized hardware interface to connect with the communication bus, the pinout configurations used by each manufacturer may vary. As a result, different cables are used to provide compatibility with different types of vehicles.

BRIEF DESCRIPTION OF THE DRAWINGS

To easily identify the discussion of any particular element or act, the most significant digit or digits in a reference number refer to the figure number in which that element is first introduced.

DETAILED DESCRIPTION

Figure 1:
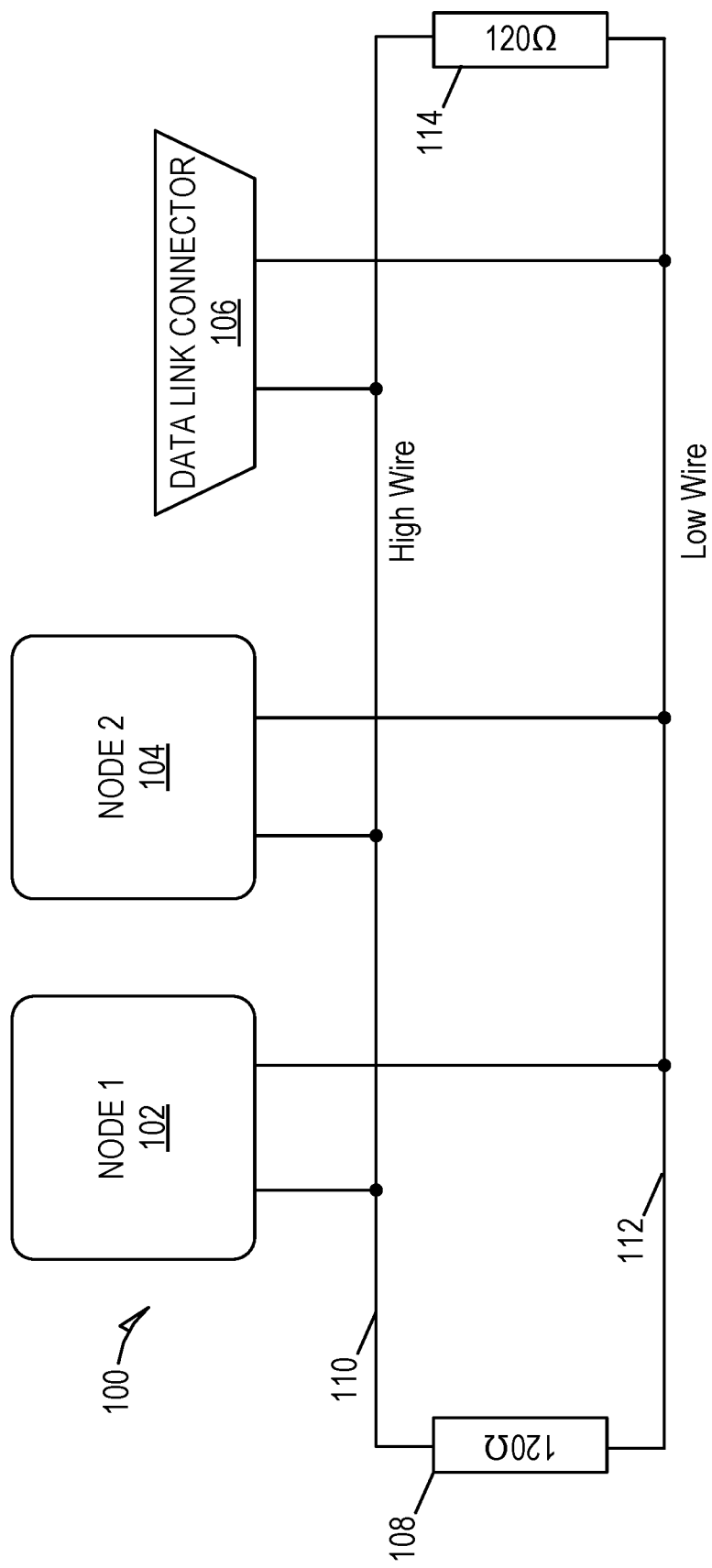
FIG. 1 is a block diagram of nodes connected to a communication bus, according to some example embodiments.

In the following description, for purposes of explanation, various details are set forth in order to provide a thorough understanding of some example embodiments. It will be apparent, however, to one skilled in the art, that the present subject matter may be practiced without these specific details, or with slight alterations.

Reference in the specification to "one embodiment" or "an embodiment" means that a particular feature, structure, or characteristic described in connection with the embodiment is included in at least one embodiment of the present subject matter. Thus, the appearances of the phrase "in one embodiment" or "in an embodiment" appearing in various places throughout the specification are not necessarily all referring to the same embodiment.

For purposes of explanation, specific configurations and details are set forth in order to provide a thorough understanding of the present subject matter. However, it will be apparent to one of ordinary skill in the art that embodiments of the subject matter described may be practiced without the specific details presented herein, or in various combinations, as described herein. Furthermore, well-known features may be omitted or simplified in order not to obscure the described embodiments. Various examples may be given throughout this description. These are merely descriptions of specific embodiments. The scope or meaning of the claims is not limited to the examples given.

Disclosed are systems, methods, and non-transitory computer-readable media for a variable multiplexer for vehicle communication bus compatibility. Vehicles often utilize a communication bus (e.g., CAN bus) to connect various computing nodes, such as sensors, electronic computing nodes (ECUs), actuators, and the like. Many communication buses include a data link connector that allows for a device to be connected to the communication bus. For example, vehicles often include a diagnostic port that allows for diagnostic tools to interface with the CAN bus by transmitting commands, reading data, and the like.

A data link connector is a physical multi-pin connection port to which an external connector (e.g., cable) may be attached. The data link connector includes a set of physical contacts, known as pins, that each function as an electrical connector and perform a specified function, such as carry a specified signal. A pinout configuration defines a mapping between each pin in a data link connector and its specified function.

To properly interface with the data link connector, an external connector includes a set of pins configured based on the pinout configuration used by the data link connector. The pins on the external connector are positioned such that when the external connector is connected to the data link connector, each pin on the external connector mates with the pin on the data link connector that provided the same specified function.

While many vehicle manufacturers use a standardized data link connector to interface the communication bus, the pinout configurations used by each manufacturer may vary. That is, multiple manufacturers may use a standardized data link connector that includes a standardized number of pins in a standardized placement, however the specified function for each pin may vary among different vehicle manufacturers. As a result, different cables are used to provide compatibility with different types of vehicles.

To alleviate this issue, a device may include a variable multiplexer that can be electronically configured to a desired pinout configuration to provide compatibility to a given vehicle. For example, the variable multiplexer may be electronically configured based on the vehicle to which the device is connected to provide a connection between pins in the device to pins on data link connector that provide the same specified function. The device may therefore be used with vehicles using a variety of pinout configurations while using a single standardized cable.

The device may determine the proper pinout configuration to provide compatibility with a vehicle using a variety of techniques. For example, in some embodiments, the device provides an identifier for the vehicle (e.g., Vehicle Identification Number (VIN)) to a remote computing system that maintains a vehicle data index. The vehicle data index includes data indicating the pinout configuration used by a variety of vehicles. The remote computing system uses the provided identifier to determine the type of vehicle (e.g., make and model) to which the device has been attached, and uses the vehicle type to identify the pinout configuration for the vehicle from the vehicle data index. The remote computing system may then return data identifying the pinout configuration to the device.

In some embodiments, the device determines the pinout configuration based on data being transmitted in across the vehicle's communication bus. For example, the device may utilize a listing mode during which data being transmitted across the communication bus is gathered by the device. The device may compare the data received at each pin to multiple know pinout configurations to determine whether the data is consistent with any of the know pinout configurations.

In some embodiments, the device may utilize a checksum value transmitted along with the data to determine the correct pinout configuration. A checksum value is a small piece of data that is transmitted along with a larger data block for the purpose of error detection. For example, the checksum value is generated (e.g., calculated) based on the data block using an algorithm, such as a hashing algorithm. A device that receives the data block may use the same algorithm to generate a checksum value from the data block, which can be compared to the checksum value received in the data transmission. Matching checksum values indicates that the data block was received without error. In this type of embodiment, the device may use the checksum value to attempt to verify the data based on multiple know pinout configurations to identify a pinout configuration that results in matching checksum values.

FIG. 1 is a block diagram of nodes connected to a communication bus 100, according to some example embodiments. As shown, the communication bus 100 includes two signal wires (i.e., a high wire 110 and a low wire 112) that connect multiple nodes 102, 104. The two signal wires 110, 112 are connected at each end by terminator resistors 108, 114. As shown, the terminator resistors 108, 114 are each 120 Ohm resistors, as is standard in high-speed communication buses such as CAN bus, however a different resistor may be used based on the specifications of the communication bus 100 that is used.

Although only two nodes 102, 104 are shown as being connected to the communication bus 100, any number of nodes 102, 104 may be connected to the communication bus 100. A node may be any type of general computing device capable of network communication with other computing devices (e.g., nodes). For example, each node can include some or all of the features, components, and peripherals of the machine 800 shown in FIG. 8. Examples of nodes 102, 104 include sensors, ECUs, actuators, accessory devices, and the like.

As shown, a data link connector 106 is also connected to the communication bus 100. The data link connector 106 is a physical multi-pin connection port to which an external connector (e.g., cable) may be attached to allow for an external device to be connected to the communication bus 100. An external device is any type of computing device that is designed to interface with communication bus 100 via a data link connector 106. For example, the data link connector 106 may be a diagnostic port, such as an On-Board Diagnostics (OBD) port, that allows for external devices such as diagnostic tools to interface with the communication bus 100 by transmitting commands, reading data, and the like. The data link connector 106 includes a set of physical contacts, known as pins. Each pin function as an electrical connector and performs a specified function, such as carrying a specified signal. A pinout configuration defines a mapping between each pin in the data link connector 106 and its specified function.

To properly interface with the data link connector 106, an external connector includes a set of pins configured based on the pinout configuration used by the data link connector 106. The pins on the external connector are positioned such that when the external connector is connected to the data link connector 106, each pin on the external connector mates with a corresponding pin on the data link connector 106 that provided the same specified function.

While many vehicle manufacturers use a standardized data link connector 106, such as 16-pin connector, to interface with the communication bus 100, the pinout configurations used by each manufacturer may vary. For example, multiple manufacturers may use a standardized data link connector 106 that includes a standardized number of pins (e.g., 16 pins) in a standardized placement, however the specified function for some or all of the pins may vary among different vehicle manufacturers. Due to the variety of pinout configurations that are used by vehicle manufacturers, current systems rely of different cables to provide compatibility with different types of vehicles.

Figure 2:
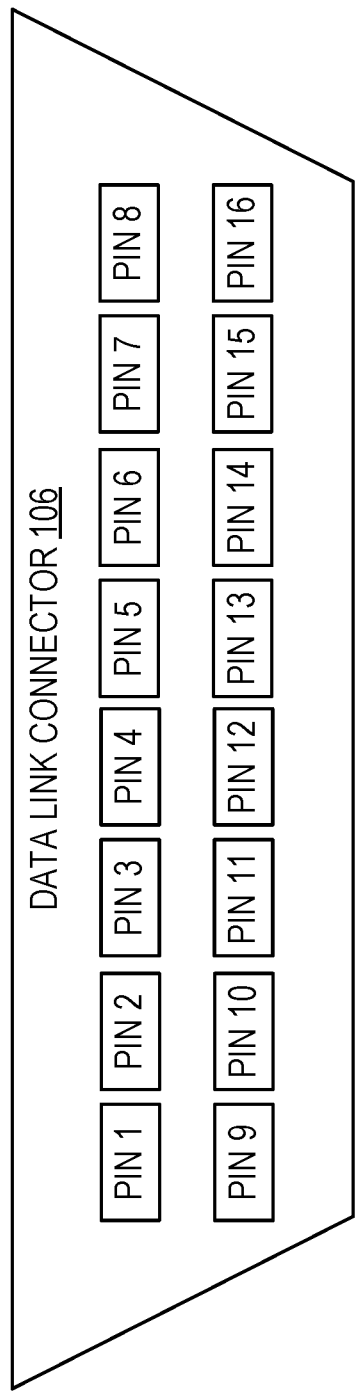
FIG. 2 is a block diagram of a data link connector, according to some example embodiments.

FIG. 2 is a block diagram of a data link connector 106, according to some example embodiments. As shown, the data link connector 106 includes 16 pins arranged in two rows as is commonly used for vehicle OBD ports. Each pin is a physical contact that is configured to perform a specified function, such as carrying a specified signal and/or data. A pinout configuration defines the mapping between each pin in the data link connector 106 and its specified function. For example, the pinout configuration may indicate that a specified pin (e.g., PIN 1) connects to the high wire 110 of the communication bus 100. As another example, the pinout configuration may indicate that a specified pin (e.g., PIN 2) connects to ground or the chassis of the vehicle.

While any pinout configuration may be developed and used, currently there are standardized pinout configurations in place to provide some level of consistency. For example, the OBD standard defines a standardized pinout configuration that defines the specific functionality of some of the pins in the data link connector 106, while leaving other pins to be used at the discretion of each manufacturer. For example, the OBD standard defines the specific functionality of pins 2, 4, 5, 6, 7, 10, 14, 15 and 16, and designates pins 1, 3, 8, 9, 11, 12 and 13 as discretionary pins to be used at the discretion of each manufacturer. While the discretionary pins provide manufacturers with the flexibility to configure the data link connector 106 to their specific needs, it also results in the current practice of using different cables to provide compatibility with different types of vehicles.

Figure 3A:
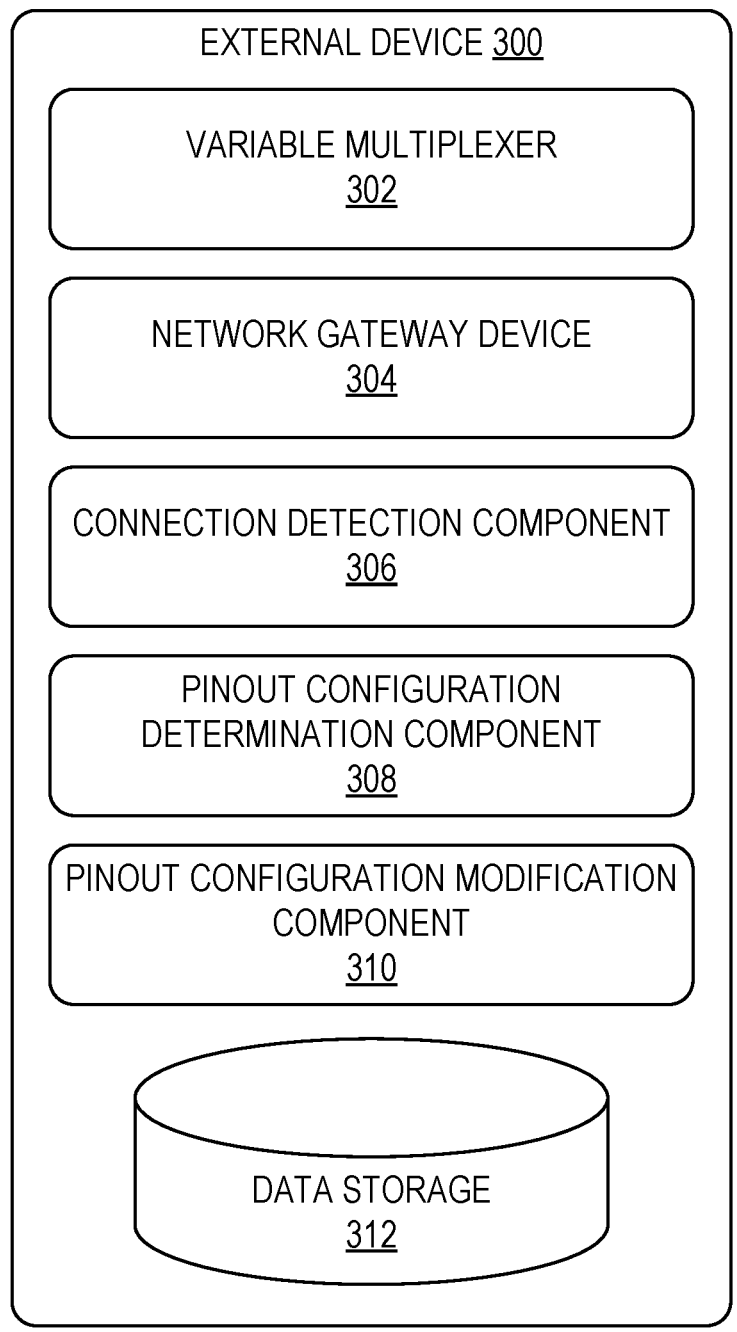
FIGS. 3A and 3B are block diagrams of an external device including a variable multiplexer for vehicle compatibility, according to some example embodiments.
Figure 3B:
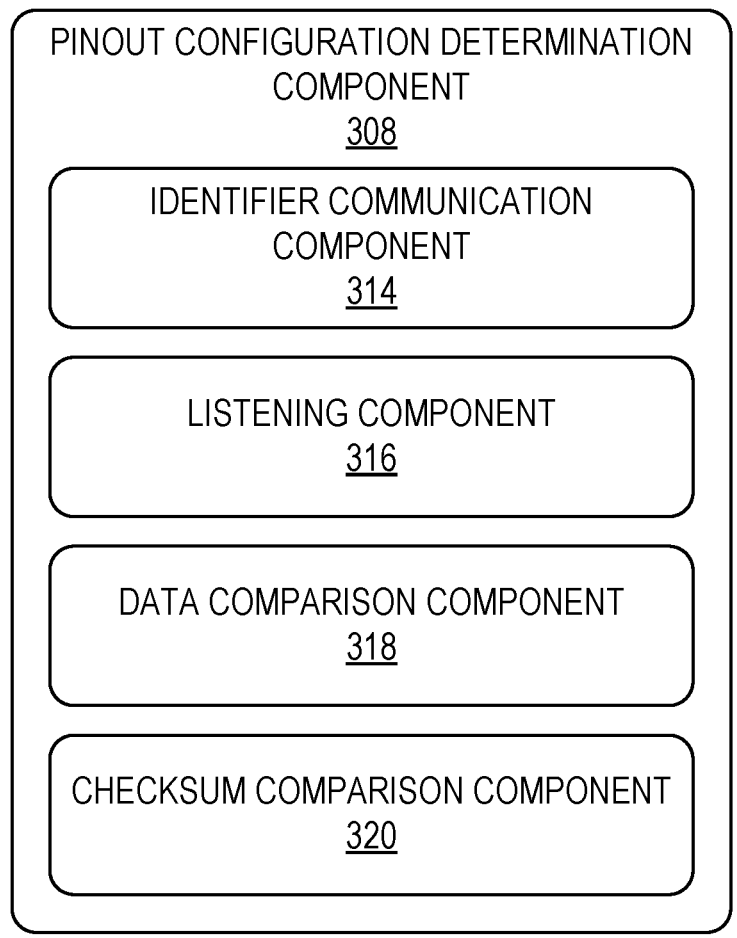

FIGS. 3A and 3B are block diagrams of an external device 300 including a variable multiplexer 302 for vehicle compatibility, according to some example embodiments. To avoid obscuring the inventive subject matter with unnecessary detail, various functional components (e.g., software components) that are not germane to conveying an understanding of the inventive subject matter have been omitted from FIGS. 3A and 3B. However, a skilled artisan will readily recognize that various additional functional components may be supported by the external device 300 to facilitate additional functionality that is not specifically described herein. Furthermore, the various functional components depicted in FIGS. 3A and 3B may reside on a single device or may be distributed across multiple devices. For example, the network gateway device 304 may be a separate physical device to which another device (e.g., accessory) is attached by a connector such as a Universal Serial Bus (USB) cable.

As shown in FIG. 3A, the external device 300 includes a variable multiplexer 302, a network gateway device 304, a connection detection component 306, a pinout configuration determination component 308, a pinout configuration modification component 310, and a data storage 312.

The variable multiplexer 302 is a multiplexer that can be programmatically configured to perform accordingly to multiple pinout configurations. For example, the variable multiplexer 302 includes multiple input lines and output lines and can be configured such that each input line can be connected to a desired output line or disabled (e.g., the input line is not connected to an output line). Each input line can correspond to one of the pins on the data link connector 106 and each output line can correspond to a pin on the external device 300 that provides a specified function. The variable multiplexer 302 can be configured based on the pinout configuration used by the communication bus 100 to create connections between the pins on the data link connector 106 to their corresponding pins on the external device 300 that provide the same specified functions. The ability to configure the variable multiplexer 302 based on multiple pinout configurations provides for compatibility between the external device 300 and various vehicles with use of a single cable.

The network gateway device 304 is a hardware device that acts as a gate to a network and enables traffic to flow in and out of the network to other networks. For example, the network gateway device 304 provides wireless communication capabilities with remote computing systems (not shown). That is, the network gateway device 304 is enabled to connect with wireless networks (e.g., cellular, wireless local area network, satellite communication networks, etc.), for purposes of communicating with other devices. The network gateway device 304 may also provide additional functionality, such as firewall functionality by filtering inbound and outbound communications, disallowing incoming communications from suspicious or unauthorized sources, etc.

The connection detection component 306 detects when the external device 300 has been connected to a communication bus 100. This may include detecting that the external device 300 has been connected directly to a communication bus 100 and/or that the external device 300 has been connected to another device (e.g., a network gateway device 304) that is connected directly to the communication bus 100. The connection detection component 306 may notify the pinout configuration determination component 308 that the external device 300 has been connected to a communication bus 100.

The pinout configuration determination component 308 determines the pinout configuration used by the data link connector 106 for communicating with the data communication bus 100. The pinout configuration determination component 308 may determine the proper pinout configuration to provide compatibility using a variety of techniques. For example, in some embodiments, the pinout configuration determination component 308 provides an identifier for the vehicle (e.g., Vehicle Identification Number (VIN)) to a remote computing system (not shown) that maintains a vehicle data index. The vehicle data index includes data indicating the pinout configuration used by a variety of vehicles.

In this type of embodiment, the pinout configuration determination component 308 gathers an identifier for the vehicle and causes the identifier to be transmitted to the remote computing system. The identifier may be any type of unique identifier for the vehicle that may be used to derive the make and/or model of the vehicle. For example, the identifier may be a VIN.

The pinout configuration determination component 308 communicates with the network gateway device 304 to cause the identifier to be transmitted to the remote computing system. For example, the pinout configuration determination component 308 provides the network gateway device 304 with the identifier along with an instruction or command to transmit the identifier to the remote computing system.

The remote computing system uses the provided identifier to determine the type of vehicle (e.g., make and model) to which the external device 300 has been attached, and uses the vehicle type to identify the pinout configuration for the vehicle from the vehicle data index. The remote computing system may then return data identifying the pinout configuration to the external device 300.

In some embodiments, the pinout configuration determination component 308 determines the pinout configuration based on data being transmitted across the communication bus 100. For example, the pinout configuration determination component 308 may utilize a listing mode during which data being transmitted across the communication bus 100 is gathered by the pinout configuration determination component 308. The pinout configuration determination component 308 may compare the data received at each pin to multiple know pinout configurations to determine whether the data is consistent with any of the know pinout configurations. The pinout configuration determination component 308 may access the known pinout configurations from the data storage 312. The know pinout configurations may include pinout configurations that are known to be used by various vehicle manufacturers.

In some embodiments, the pinout configuration determination component 308 may utilize a checksum value transmitted along with the data to determine the correct pinout configuration. A checksum value is a small piece of data that is transmitted along with a larger data block for the purpose of error detection. For example, the checksum value is generated prior to transmission of the data by using the data block as input into an algorithm, such as a hashing algorithm. Any device that receives the data block and checksum value may use the same algorithm to generate a checksum value from the received data block, which can be compared to the checksum value received in the data transmission. Matching checksum values indicates that the data block was received without error. In this type of embodiment, the pinout configuration determination component 308 may use the checksum value to attempt to verify data based on multiple know pinout configurations to identify a pinout configuration that results in matching checksum values. The functionality of the pinout configuration determination component 308 is described in greater detail below in relation to FIG. 3B.

The pinout configuration determination component 308 provides the pinout configuration modification component 310 with data identifying the pinout configuration used by the data link connector 106. For example, the data may be an identifier assigned to a know pinout configuration stored in the data storage 312. Alternatively, the data may be data identifying one of the pinout configurations from a set of pinout configurations into which the variable multiplexer 302 can be configuration. As another example, the data may be data identifying the functions assigned to each pin of the data link connector 106 and/or data identifying the pins on the external device 300 that provide the same function as the pins of the data link connector 106.

In any case, the pinout configuration modification component 310 transmits a command to cause the variable multiplexer 302 to modify its configuration based on the determined pinout configuration.

FIG. 3B shows a block diagram of the pinout configuration determination component 308, according to some example embodiments. As shown, the pinout configuration determination component 308 includes an identifier communication component 314, a listening component 316, a data comparison component 318, and a checksum comparison component 320.

The identifier communication component 314 manages communications with the remote computing system to determine the pinout configuration used by the data link connector 106. For example, the identifier communication component 314 gathers the identifier for the vehicle and provides the identifier to the network gateway device 304. The identifier communication component 314 may gather the identifier from another component to which the external device 300 is connected. For example, the identifier communication component 314 may gather the identifier from the network gateway device 304. Accordingly, in some embodiments, the identifier communication component 314 may instruct the network gateway device 304 to transmit the identifier to the remote computing system. The identifier communication component 314 may also receive data from the network gateway device 304, such as data that identifies the pinout configuration used by the vehicle. For example, the remote computing system may return the data to the network gateway device 304, which then provides the data to the identifier communication component 314.

The listening component 316 initiates a listening mode during which data transmitted across the communication bus 100 is gathered by the external device 300. For example, each pin of the data link connector 106 is monitored for any received signal or data. The listening component 316 may provide the gathered data to the other components of the pinout configuration determination component 308. For example, the listing component 316 may provide the data to the data comparison component 318 and/or the checksum comparison component 320.

The data comparison component 318 compares the data gathered by the listening component 316 to a set of known pinout configurations. The known pinout configurations may include different pinout configurations that are known to be used by various vehicle manufacturers. The pinout configuration determination component 308 compares the data received at each pin to the expected data that should be received at each pin based the know pinout configurations to identify a known pinout configuration that is consistent with the data gathered by the listing component 316.

To accomplish this, in some embodiments, the pinout configuration determination component 308 uses the data gathered by the listening component 316 to determine a set of enabled pins from which data and/or a signal was received during the listing mode, as well as a set of disabled pins from which data and/or a signal was not received during the listing. The pinout configuration determination component 308 may then compare the determined sets of enabled and disabled pins to the know pinout configurations to identify pinout configurations that utilize matching sets of enabled and disabled pins.

In the event that multiple known pinout configurations use a matching set of enabled and disabled pins, the pinout configuration determination component 308 may perform additional comparisons to determine the correct pinout configuration. For example, the pinout configuration determination component 308 may identify a common pin (e.g., PIN 3) in the remaining known pinout configurations (e.g., the known pinout configurations that use matching sets of enabled and disabled pins) that is assigned different functions in each of the known pinout configurations. The pinout configuration determination component 308 may then analyze the data or signal received at the pin (e.g., PIN 3) during the listing mode to determine which pinout configuration properly characterizes the function of the pin.

The checksum comparison component 320 utilize a checksum value transmitted along with the data to determine the correct pinout configuration. A checksum value is a small piece of data that is transmitted along with a larger data block for the purpose of error detection. For example, the checksum value is generated prior to transmission of the data block by using the data block as input into an algorithm, such as a hashing algorithm. Any device that receives the data block may use the same algorithm to generate a checksum value from the received data block, which can then be compared to the checksum value received in the data transmission. Matching checksum values indicate that the data block was received without error.

The checksum comparison component 320 uses the checksum value to attempt to verify data based on multiple know pinout configurations to identify a pinout configuration that results in matching checksum values. For example, the checksum comparison component 320 uses data from specified pins based on the various known pinout configurations and attempts to validate the data using the checksum value. For example, the checksum comparison component 320 identifies a data block and checksum value in the received data and uses the appropriate algorithm to generate a checksum value based on the data block. The checksum comparison component 320 then compares the generated checksum value to the checksum value received in the data. Matching checksum values indicate that the data was received without error, further indicating that the know pinout configuration used to evaluate the data is the pinout configuration that is being used by the data link connector 106.

Figure 4:
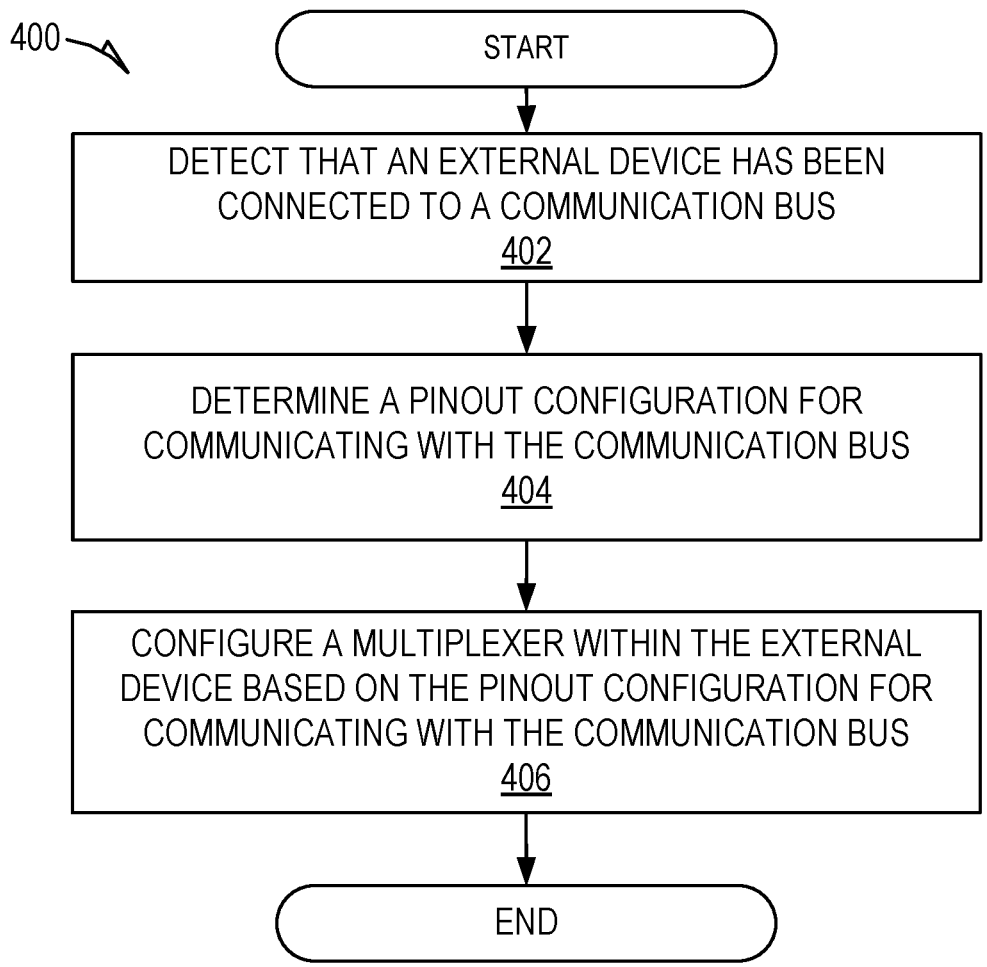
FIG. 4 is a flowchart showing a method for using a variable multiplexer for vehicle communication bus compatibility, according to some example embodiments.

FIG. 4 is a flowchart showing a method 400 for using a variable multiplexer 302 for vehicle communication bus 100 compatibility, according to some example embodiments. The method 400 may be embodied in computer readable instructions for execution by one or more processors such that the operations of the method 400 may be performed in part or in whole by the external device 300; accordingly, the method 400 is described below by way of example with reference thereto. However, it shall be appreciated that at least some of the operations of the method 400 may be deployed on various other hardware configurations and the method 400 is not intended to be limited to the external device 300.

At operation 402, the connection detection component 306 detects that the external device 300 has been connected to a communication bus 100. This may include detecting that the external device 300 has been connected directly to the communication bus 100 and/or that the external device 300 has been connected to another device (e.g., a network gateway device 304) that is connected directly to the communication bus 100. The connection detection component 306 may notify the pinout configuration determination component 308 that the external device 300 has been connected to a communication bus 100.

At operation 404, the pinout configuration determination component 308 determines a pinout configuration for communicating with the communication bus 100. The pinout configuration defines the mapping between each pin in the data link connector 106 and its specified function. For example, the pinout configuration may indicate that a specified pin (e.g., PIN 1) connects to the high wire 110 of the communication bus 100. As another example, the pinout configuration may indicate that a specified pin (e.g., PIN 2) connects to ground or the chassis of the vehicle. The pinout configuration determination component 308 may determine the proper pinout configuration to provide compatibility using a variety of techniques, such as those described in relation to FIGS. 5 and 6 below.

The pinout configuration determination component 308 provides the pinout configuration modification component 310 with data identifying the pinout configuration that was determined to be used by the data link connector 106. For example, the data may include an identifier assigned to a known pinout configuration stored in the data storage 312. Alternatively, the data may be an identifier for one of a set of pinout configuration into which the variable multiplexer 302 may be configured. As another example, the data may be data identifying the functions assigned to each pin of the data link connector 106 and/or data identifying the pins on the external device 300 that provide the same function as the pins of the data link connector 106.

At operation 406, the pinout configuration modification component 310 configures a variable multiplexer 302 within the external device 300 based on the pinout configuration for communicating with the communication bus 100. For example, the pinout configuration modification component 310 transmits a command to cause the variable multiplexer 302 to modify its configuration based on the determined pinout configuration.

Figure 5:
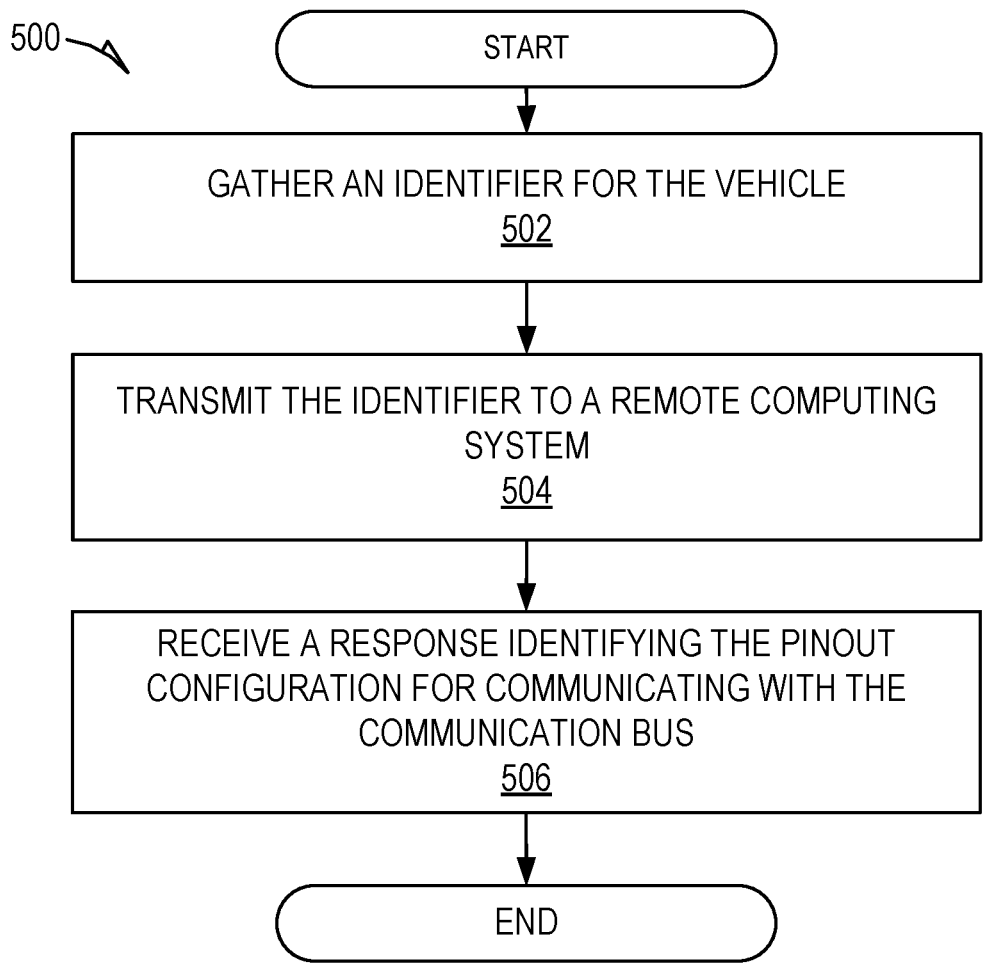
FIG. 5 is a flowchart showing a method of communicating with a remote computing system to determine a pinout configuration for communicating with a communication bus, according to some example embodiments.

FIG. 5 is a flowchart showing a method 500 of communicating with a remote computing system to determine a pinout configuration for communicating with a communication bus 100, according to some example embodiments. The method 500 may be embodied in computer readable instructions for execution by one or more processors such that the operations of the method 500 may be performed in part or in whole by the external device 300; accordingly, the method 500 is described below by way of example with reference thereto. However, it shall be appreciated that at least some of the operations of the method 500 may be deployed on various other hardware configurations and the method 500 is not intended to be limited to the external device 300.

At operation 502, the identifier communication component 314 gathers an identifier for the vehicle. The identifier may be any type of unique identifier for the vehicle that may be used to derive the make and/or model of the vehicle. For example, the identifier may be a Vehicle Identification number (VIN).

At operation 504, the identifier communication component 314 transmits the identifier to a remote computing system. The pinout configuration determination component 308 utilizes the network gateway device 304 to cause the identifier to be transmitted to the remote computing system. For example, the identifier communication component 314 provides the network gateway device 304 with the identifier along with an instruction or command to transmit the identifier to the remote computing system.

The remote computing system maintains a vehicle data index that includes data indicating the pinout configuration used by a variety of vehicles. The remote computing system uses the provided identifier to determine the type of vehicle (e.g., make and model) to which the device has been attached, and uses the vehicle type to identify the pinout configuration for the vehicle from the vehicle data index. The remote computing system may then return data identifying the pinout configuration to the external device 300.

At operation 506, the identifier communication component 314 receives a response indicating whether the pinout configuration for communicating with the communication bus 100. For example, the remote computing system returns data identifying the pinout configuration to the external device 300, which is received by the network gateway device 304. The network gateway device 304 then provides the received data identifying the pinout configuration to the identifier communication component 314.

Figure 6:
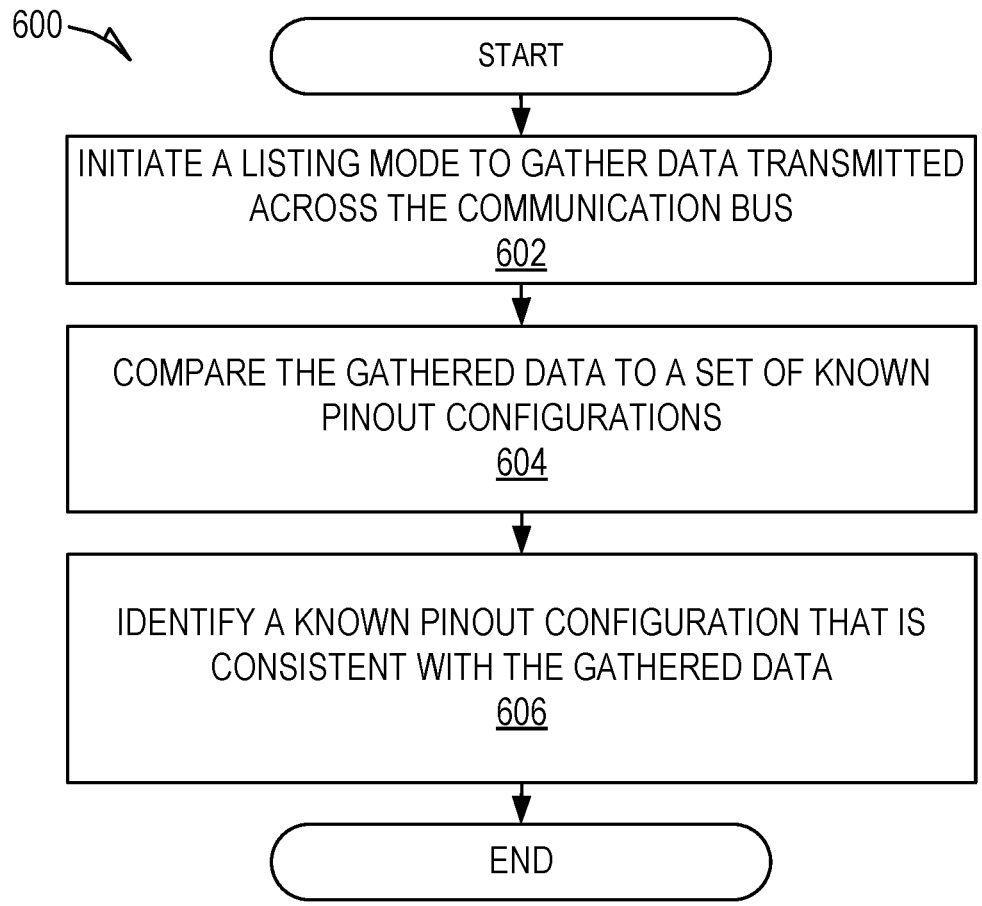
FIG. 6 is a flowchart showing a method of using data gathered during a listing mode to determine a pinout configuration for communicating with a communication bus, according to some example embodiments.

FIG. 6 is a flowchart showing a method 600 of using data gathered during a listing mode to determine a pinout configuration for communicating with a communication bus 100, according to some example embodiments. The method 600 may be embodied in computer readable instructions for execution by one or more processors such that the operations of the method 600 may be performed in part or in whole by the external device 300; accordingly, the method 600 is described below by way of example with reference thereto. However, it shall be appreciated that at least some of the operations of the method 600 may be deployed on various other hardware configurations and the method 600 is not intended to be limited to the external device 300.

At operation 602, the listing component 316 initiates a listing mode to gather data transmitted across the communication bus 100. For example, the listing component 316 monitors each pin of the data link connector 106 for any received signal or data. The listing component 316 provides the gathered data to the data comparison component 318.

At operation 604, the data comparison component 318 compares the gathered data to a set of known pinout configurations. The known pinout configurations may include different pinout configurations that are known to be used by various vehicle manufacturers. The pinout configuration determination component 308 compares the data received at each pin to the expected data that should be received at each pin based the know pinout configurations to identify a known pinout configuration that is consistent with the data gathered by the listing component 316.

At operation 606, the data comparison component 318 identifies a known pinout configuration that is consistent with the gathered data. To accomplish this, the pinout configuration determination component 308 uses the data gathered by the listening component 316 to determine a set of enabled pins from which data and/or a signal was received during the listing mode, as well as a set of disabled pins from which data and/or a signal was not received during the listing. The pinout configuration determination component 308 may then compare the determined sets of enabled and disabled pins to the know pinout configurations to identify pinout configurations that utilize matching sets of enabled and disabled pins.

In the event that multiple known pinout configurations use a matching set of enabled and disabled pins, the pinout configuration determination component 308 may perform additional comparisons to determine the correct pinout configuration. For example, the pinout configuration determination component 308 may identify a common pin (e.g., PIN 3) in the remaining known pinout configurations (e.g., the known pinout configurations that use matching sets of enabled and disabled pins) that is assigned different functions in each of the known pinout configurations. The pinout configuration determination component 308 may then analyze the data or signal received at the pin (e.g., PIN 3) during the listing mode to determine which pinout configuration properly characterizes the function of the pin.

Software Architecture

Figure 7:
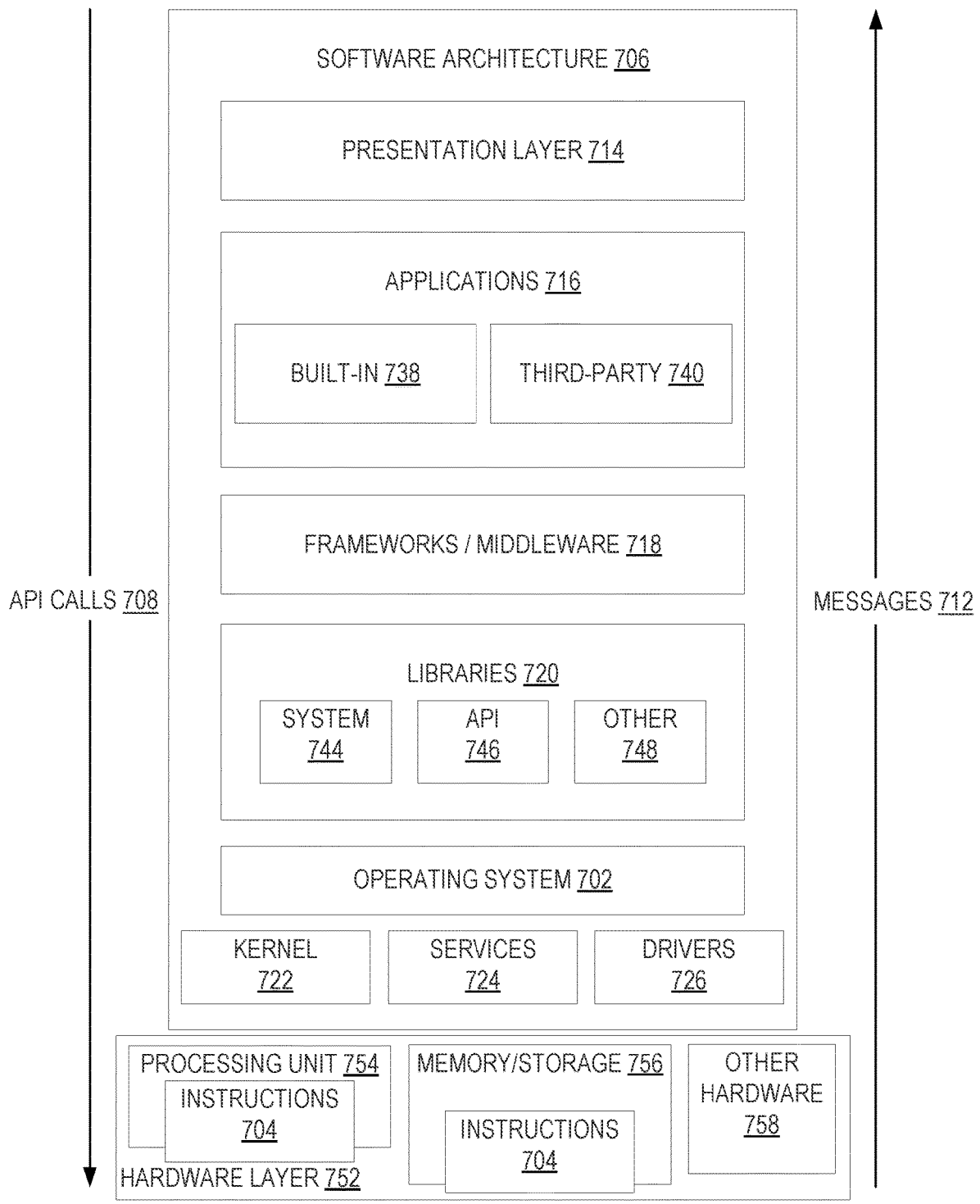
FIG. 7 is a block diagram illustrating an example software architecture, which may be used in conjunction with various hardware architectures herein described.

FIG. 7 is a block diagram illustrating an example software architecture 706, which may be used in conjunction with various hardware architectures herein described. FIG. 7 is a non-limiting example of a software architecture 706 and it will be appreciated that many other architectures may be implemented to facilitate the functionality described herein. The software architecture 706 may execute on hardware such as machine 800 of FIG. 8 that includes, among other things, processors 804, memory 814, and (input/output) I/O components 818. A representative hardware layer 752 is illustrated and can represent, for example, the machine 800 of FIG. 8. The representative hardware layer 752 includes a processing unit 754 having associated executable instructions 704. Executable instructions 704 represent the executable instructions of the software architecture 706, including implementation of the methods, components, and so forth described herein. The hardware layer 752 also includes memory and/or storage modules 756, which also have executable instructions 704. The hardware layer 752 may also comprise other hardware 758.

In the example architecture of FIG. 7, the software architecture 706 may be conceptualized as a stack of layers where each layer provides particular functionality. For example, the software architecture 706 may include layers such as an operating system 702, libraries 720, frameworks/middleware 718, applications 716, and a presentation layer 714. Operationally, the applications 716 and/or other components within the layers may invoke application programming interface (API) calls 708 through the software stack and receive a response such as messages 712 in response to the API calls 708. The layers illustrated are representative in nature and not all software architectures have all layers. For example, some mobile or special purpose operating systems may not provide a frameworks/middleware 718, while others may provide such a layer. Other software architectures may include additional or different layers.

The operating system 702 may manage hardware resources and provide common services. The operating system 702 may include, for example, a kernel 722, services 724, and drivers 726. The kernel 722 may act as an abstraction layer between the hardware and the other software layers. For example, the kernel 722 may be responsible for memory management, processor management (e.g., scheduling), component management, networking, security settings, and so on. The services 724 may provide other common services for the other software layers. The drivers 726 are responsible for controlling or interfacing with the underlying hardware. For instance, the drivers 726 include display drivers, camera drivers, Bluetooth® drivers, flash memory drivers, serial communication drivers (e.g., Universal Serial Bus (USB) drivers), Wi-Fi® drivers, audio drivers, power management drivers, and so forth, depending on the hardware configuration.

The libraries 720 provide a common infrastructure that is used by the applications 716 and/or other components and/or layers. The libraries 720 provide functionality that allows other software components to perform tasks in an easier fashion than to interface directly with the underlying operating system 702 functionality (e.g., kernel 722, services 724, and/or drivers 726). The libraries 720 may include system libraries 744 (e.g., C standard library) that may provide functions such as memory allocation functions, string manipulation functions, mathematical functions, and the like. In addition, the libraries 720 may include API libraries 746 such as media libraries (e.g., libraries to support presentation and manipulation of various media format such as MPEG4, H.264, MP3, AAC, AMR, JPG, PNG), graphics libraries (e.g., an OpenGL framework that may be used to render 2D and 3D in a graphic content on a display), database libraries (e.g., SQLite that may provide various relational database functions), web libraries (e.g., WebKit that may provide web browsing functionality), and the like. The libraries 720 may also include a wide variety of other libraries 748 to provide many other APIs to the applications 716 and other software components/modules.

The frameworks/middleware 718 (also sometimes referred to as middleware) provide a higher-level common infrastructure that may be used by the applications 716 and/or other software components/modules. For example, the frameworks/middleware 718 may provide various graphical user interface (GUI) functions, high-level resource management, high-level location services, and so forth. The frameworks/middleware 718 may provide a broad spectrum of other APIs that may be used by the applications 716 and/or other software components/modules, some of which may be specific to a particular operating system 702 or platform.

The applications 716 include built-in applications 738 and/or third-party applications 740. Examples of representative built-in applications 738 may include, but are not limited to, a contacts application, a browser application, a book reader application, a location application, a media application, a messaging application, and/or a game application. Third-party applications 740 may include an application developed using the ANDROID™ or IOS™ software development kit (SDK) by an entity other than the vendor of the particular platform, and may be mobile software running on a mobile operating system such as IOS™, ANDROID™, WINDOWS® Phone, or other mobile operating systems. The third-party applications 740 may invoke the API calls 708 provided by the mobile operating system (such as operating system 702) to facilitate functionality described herein.

The applications 716 may use built in operating system functions (e.g., kernel 722, services 724, and/or drivers 726), libraries 720, and frameworks/middleware 718 to create UIs to interact with users of the system. Alternatively, or additionally, in some systems, interactions with a user may occur through a presentation layer, such as presentation layer 714.

In these systems, the application/component "logic" can be separated from the aspects of the application/component that interact with a user.

Figure 8:
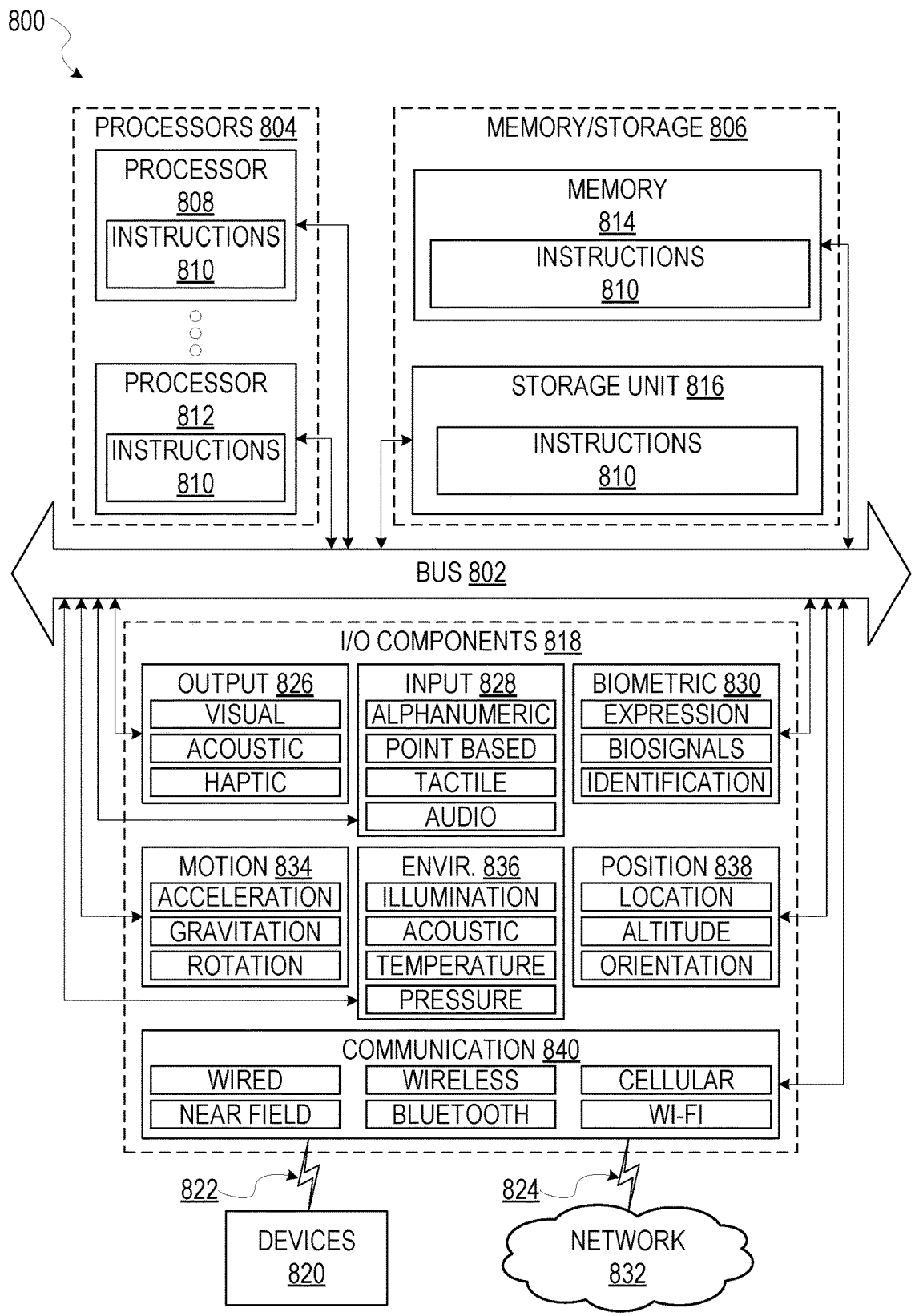
FIG. 8 is a block diagram illustrating components of a machine, according to some example embodiments, able to read instructions from a machine-readable medium (e.g., a machine-readable storage medium) and perform any one or more of the methodologies discussed herein.

FIG. 8 is a block diagram illustrating components of a machine 800, according to some example embodiments, able to read instructions 704 from a machine-readable medium (e.g., a machine-readable storage medium) and perform any one or more of the methodologies discussed herein. Specifically, FIG. 8 shows a diagrammatic representation of the machine 800 in the example form of a computer system, within which instructions 810 (e.g., software, a program, an application, an applet, an app, or other executable code) for causing the machine 800 to perform any one or more of the methodologies discussed herein may be executed. As such, the instructions 810 may be used to implement modules or components described herein. The instructions 810 transform the general, non-programmed machine 800 into a particular machine 800 programmed to carry out the described and illustrated functions in the manner described. In alternative embodiments, the machine 800 operates as a standalone device or may be coupled (e.g., networked) to other machines. In a networked deployment, the machine 800 may operate in the capacity of a server machine or a client machine in a server-client network environment, or as a peer machine in a peer-to-peer (or distributed) network environment. The machine 800 may comprise, but not be limited to, a server computer, a client computer, a PC, a tablet computer, a laptop computer, a netbook, a set-top box (STB), a personal digital assistant (PDA), an entertainment media system, a cellular telephone, a smart phone, a mobile device, a wearable device (e.g., a smart watch), a smart home device (e.g., a smart appliance), other smart devices, a web appliance, a network router, a network switch, a network bridge, or any machine 800 capable of executing the instructions 810, sequentially or otherwise, that specify actions to be taken by machine 800. Further, while only a single machine 800 is illustrated, the term "machine" shall also be taken to include a collection of machines that individually or jointly execute the instructions 810 to perform any one or more of the methodologies discussed herein.

The machine 800 may include processors 804, memory/storage 806, and I/O components 818, which may be configured to communicate with each other such as via a bus 802. The memory/storage 806 may include a memory 814, such as a main memory, or other memory storage, and a storage unit 816, both accessible to the processors 804 such as via the bus 802. The storage unit 816 and memory 814 store the instructions 810 embodying any one or more of the methodologies or functions described herein. The instructions 810 may also reside, completely or partially, within the memory 814, within the storage unit 816, within at least one of the processors 804 (e.g., within the processor's cache memory), or any suitable combination thereof, during execution thereof by the machine 800. Accordingly, the memory 814, the storage unit 816, and the memory of processors 804 are examples of machine-readable media.

The I/O components 818 may include a wide variety of components to receive input, provide output, produce output, transmit information, exchange information, capture measurements, and so on. The specific I/O components 818 that are included in a particular machine 800 will depend on the type of machine. For example, portable machines such as mobile phones will likely include a touch input device or other such input mechanisms, while a headless server machine will likely not include such a touch input device. It will be appreciated that the I/O components 818 may include many other components that are not shown in FIG. 8. The I/O components 818 are grouped according to functionality merely for simplifying the following discussion and the grouping is in no way limiting. In various example embodiments, the I/O components 818 may include output components 826 and input components 828. The output components 826 may include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor, resistance mechanisms), other signal generators, and so forth. The input components 828 may include alphanumeric input components (e.g., a keyboard, a touch screen configured to receive alphanumeric input, a photo-optical keyboard, or other alphanumeric input components), point based input components (e.g., a mouse, a touchpad, a trackball, a joystick, a motion sensor, or other pointing instrument), tactile input components (e.g., a physical button, a touch screen that provides location and/or force of touches or touch gestures, or other tactile input components), audio input components (e.g., a microphone), and the like.

In further example embodiments, the I/O components 818 may include biometric components 830, motion components 834, environmental components 836, or position components 838 among a wide array of other components. For example, the biometric components 830 may include components to detect expressions (e.g., hand expressions, facial expressions, vocal expressions, body gestures, or eye tracking), measure biosignals (e.g., blood pressure, heart rate, body temperature, perspiration, or brain waves), identify a person (e.g., voice identification, retinal identification, facial identification, fingerprint identification, or electroencephalogram based identification), and the like. The motion components 834 may include acceleration sensor components (e.g., accelerometer), gravitation sensor components, rotation sensor components (e.g., gyroscope), and so forth. The environmental components 836 may include, for example, illumination sensor components (e.g., photometer), temperature sensor components (e.g., one or more thermometer that detect ambient temperature), humidity sensor components, pressure sensor components (e.g., barometer), acoustic sensor components (e.g., one or more microphones that detect background noise), proximity sensor components (e.g., infrared sensors that detect nearby objects), gas sensors (e.g., gas detection sensors to detect concentrations of hazardous gases for safety or to measure pollutants in the atmosphere), or other components that may provide indications, measurements, or signals corresponding to a surrounding physical environment. The position components 838 may include location sensor components (e.g., a GPS receiver component), altitude sensor components (e.g., altimeters or barometers that detect air pressure from which altitude may be derived), orientation sensor components (e.g., magnetometers), and the like.

Communication may be implemented using a wide variety of technologies. The I/O components 818 may include communication components 840 operable to couple the machine 800 to a network 832 or devices 820 via coupling 824 and coupling 822, respectively. For example, the communication components 840 may include a network interface component or other suitable device to interface with the network 832. In further examples, communication components 840 may include wired communication components, wireless communication components, cellular communication components, near field communication (NFC) components, Bluetooth® components (e.g., Bluetooth® Low Energy), Wi-Fi® components, and other communication components to provide communication via other modalities. The devices 820 may be another machine or any of a wide variety of peripheral devices (e.g., a peripheral device coupled via a USB).

Moreover, the communication components 840 may detect identifiers or include components operable to detect identifiers. For example, the communication components 840 may include radio frequency identification (RFID) tag reader components, NFC smart tag detection components, optical reader components (e.g., an optical sensor to detect one-dimensional bar codes such as Universal Product Code (UPC) bar code, multi-dimensional bar codes such as Quick Response (QR) code, Aztec code, Data Matrix, Dataglyph, MaxiCode, PDF417, Ultra Code, UCC RSS-2D bar code, and other optical codes), or acoustic detection components (e.g., microphones to identify tagged audio signals). In addition, a variety of information may be derived via the communication components 840 such as location via Internet Protocol (IP) geo-location, location via Wi-Fi® signal triangulation, location via detecting a NFC beacon signal that may indicate a particular location, and so forth.

GLOSSARY

"CARRIER SIGNAL" in this context refers to any intangible medium that is capable of storing, encoding, or carrying instructions 810 for execution by the machine 800, and includes digital or analog communications signals or other intangible medium to facilitate communication of such instructions 810. Instructions 810 may be transmitted or received over the network 832 using a transmission medium via a network interface device and using any one of a number of well-known transfer protocols.

"CLIENT DEVICE" in this context refers to any machine 800 that interfaces to a communications network 832 to obtain resources from one or more server systems or other client devices. A client device may be, but is not limited to, mobile phones, desktop computers, laptops, PDAs, smart phones, tablets, ultra books, netbooks, laptops, multi-processor systems, microprocessor-based or programmable consumer electronics, game consoles, STBs, or any other communication device that a user may use to access a network 832.

"COMMUNICATIONS NETWORK" in this context refers to one or more portions of a network 832 that may be an ad hoc network, an intranet, an extranet, a virtual private network (VPN), a LAN, a wireless LAN (WLAN), a WAN, a wireless WAN (WWAN), a metropolitan area network (MAN), the Internet, a portion of the Internet, a portion of the Public Switched Telephone Network (PSTN), a plain old telephone service (POTS) network, a cellular telephone network, a wireless network, a Wi-Fi® network, another type of network, or a combination of two or more such networks. For example, a network 832 or a portion of a network 832 may include a wireless or cellular network and the coupling may be a Code Division Multiple Access (CDMA) connection, a Global System for Mobile communications (GSM) connection, or other type of cellular or wireless coupling. In this example, the coupling may implement any of a variety of types of data transfer technology, such as Single Carrier Radio Transmission Technology (1xRTT), Evolution-Data Optimized (EVDO) technology, General Packet Radio Service (GPRS) technology, Enhanced Data rates for GSM Evolution (EDGE) technology, third Generation Partnership Project (3GPP) including 3G, fourth generation wireless (4G) networks, Universal Mobile Telecommunications System (UMTS), High Speed Packet Access (HSPA), Worldwide Interoperability for Microwave Access (WiMAX), Long Term Evolution (LTE) standard, others defined by various standard setting organizations, other long range protocols, or other data transfer technology.

"MACHINE-READABLE MEDIUM" in this context refers to a component, device or other tangible media able to store instructions 810 and data temporarily or permanently and may include, but is not be limited to, random-access memory (RAM), read-only memory (ROM), buffer memory, flash memory, optical media, magnetic media, cache memory, other types of storage (e.g., erasable programmable read-only memory (EEPROM)), and/or any suitable combination thereof. The term "machine-readable medium" should be taken to include a single medium or multiple media (e.g., a centralized or distributed database, or associated caches and servers) able to store instructions 810. The term "machine-readable medium" shall also be taken to include any medium, or combination of multiple media, that is capable of storing instructions 810 (e.g., code) for execution by a machine 800, such that the instructions 810, when executed by one or more processors 804 of the machine 800, cause the machine 800 to perform any one or more of the methodologies described herein. Accordingly, a "machine-readable medium" refers to a single storage apparatus or device, as well as "cloud-based" storage systems or storage networks that include multiple storage apparatus or devices. The term "machine-readable medium" excludes signals per se.

"COMPONENT" in this context refers to a device, physical entity, or logic having boundaries defined by function or subroutine calls, branch points, APIs, or other technologies that provide for the partitioning or modularization of particular processing or control functions. Components may be combined via their interfaces with other components to carry out a machine process. A component may be a packaged functional hardware unit designed for use with other components and a part of a program that usually performs a particular function of related functions. Components may constitute either software components (e.g., code embodied on a machine-readable medium) or hardware components. A "hardware component" is a tangible unit capable of performing certain operations and may be configured or arranged in a certain physical manner. In various example embodiments, one or more computer systems (e.g., a standalone computer system, a client computer system, or a server computer system) or one or more hardware components of a computer system (e.g., a processor or a group of processors 804) may be configured by software (e.g., an application 716 or application portion) as a hardware component that operates to perform certain operations as described herein. A hardware component may also be implemented mechanically, electronically, or any suitable combination thereof. For example, a hardware component may include dedicated circuitry or logic that is permanently configured to perform certain operations. A hardware component may be a special-purpose processor, such as a field-programmable gate array (FPGA) or an application specific integrated circuit (ASIC). A hardware component may also include programmable logic or circuitry that is temporarily configured by software to perform certain operations. For example, a hardware component may include software executed by a general-purpose processor 804 or other programmable processor 804. Once configured by such software, hardware components become specific machines 800 (or specific components of a machine 800) uniquely tailored to perform the configured functions and are no longer general-purpose processors 804. It will be appreciated that the decision to implement a hardware component mechanically, in dedicated and permanently configured circuitry, or in temporarily configured circuitry (e.g., configured by software), may be driven by cost and time considerations. Accordingly, the phrase "hardware component" (or "hardware-implemented component") should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware components are temporarily configured (e.g., programmed), each of the hardware components need not be configured or instantiated at any one instance in time. For example, where a hardware component comprises a general-purpose processor 804 configured by software to become a special-purpose processor, the general-purpose processor 804 may be configured as respectively different special-purpose processors (e.g., comprising different hardware components) at different times. Software accordingly configures a particular processor or processors 804, for example, to constitute a particular hardware component at one instance of time and to constitute a different hardware component at a different instance of time. Hardware components can provide information to, and receive information from, other hardware components. Accordingly, the described hardware components may be regarded as being communicatively coupled. Where multiple hardware components exist contemporaneously, communications may be achieved through signal transmission (e.g., over appropriate circuits and buses 802) between or among two or more of the hardware components. In embodiments in which multiple hardware components are configured or instantiated at different times, communications between such hardware components may be achieved, for example, through the storage and retrieval of information in memory structures to which the multiple hardware components have access. For example, one hardware component may perform an operation and store the output of that operation in a memory device to which it is communicatively coupled. A further hardware component may then, at a later time, access the memory device to retrieve and process the stored output. Hardware components may also initiate communications with input or output devices, and can operate on a resource (e.g., a collection of information). The various operations of example methods described herein may be performed, at least partially, by one or more processors 804 that are temporarily configured (e.g., by software) or permanently configured to perform the relevant operations. Whether temporarily or permanently configured, such processors 804 may constitute processor-implemented components that operate to perform one or more operations or functions described herein. As used herein, "processor-implemented component" refers to a hardware component implemented using one or more processors 804. Similarly, the methods described herein may be at least partially processor-implemented, with a particular processor or processors 804 being an example of hardware. For example, at least some of the operations of a method may be performed by one or more processors 804 or processor-implemented components. Moreover, the one or more processors 804 may also operate to support performance of the relevant operations in a "cloud computing" environment or as a "software as a service" (SaaS). For example, at least some of the operations may be performed by a group of computers (as examples of machines 800 including processors 804), with these operations being accessible via a network 832 (e.g., the Internet) and via one or more appropriate interfaces (e.g., an API). The performance of certain of the operations may be distributed among the processors 804, not only residing within a single machine 800, but deployed across a number of machines 800. In some example embodiments, the processors 804 or processor-implemented components may be located in a single geographic location (e.g., within a home environment, an office environment, or a server farm). In other example embodiments, the processors 804 or processor-implemented components may be distributed across a number of geographic locations.

"PROCESSOR" in this context refers to any circuit or virtual circuit (a physical circuit emulated by logic executing on an actual processor 804) that manipulates data values according to control signals (e.g., "commands," "op codes," "machine code," etc.) and which produces corresponding output signals that are applied to operate a machine 800. A processor 804 may be, for example, a central processing unit (CPU), a reduced instruction set computing (RISC) processor, a complex instruction set computing (CISC) processor, a graphics processing unit (GPU), a digital signal processor (DSP), an ASIC, a radio-frequency integrated circuit (RFIC) or any combination thereof. A processor 804 may further be a multi-core processor having two or more independent processors 804 (sometimes referred to as "cores") that may execute instructions 810 contemporaneously.

What is claimed is:

1. A method comprising:
   maintaining a vehicle data index including data identifying pinout configurations for a plurality of vehicles;
   responsive to a device having been connected to a communication bus implemented within a vehicle, the device being connected to the communication bus via a data link connector that includes a set of pins for communicating with the communication bus, receiving, from the device, an identifier associated with the vehicle;
   determining a pinout configuration for the device communicating with the communication bus based on the maintained vehicle data index and the identifier associated with the vehicle; and
   transmitting, to the device, a response message identifying the pinout configuration for a multiplexer for communicating with the communication bus via the data link connector.

2. The method of claim 1, wherein the device includes a network gateway device, the network gateway device providing wireless communication capabilities for the device.

3. The method of claim 2, wherein the response message identifying the pinout configuration for the multiplexer for communicating with the communication bus via the data link connector is transmitted to the network gateway device.

4. The method of claim 1, wherein the identifier is a Vehicle Identification Number (VIN).

5. The method of claim 1, wherein the determining a pinout configuration for the device communicating with the communication bus based on the maintained vehicle data index and the identifier associated with the vehicle further comprises:
   determining a type of vehicle based on the identifier associated with the vehicle; and
   identifying, in the maintained vehicle data index, a pinout configuration associated with the determined type of vehicle.

6. The method of claim 5, wherein the type of vehicle comprises a vehicle make and a vehicle model.

7. The method of claim 1, wherein the device includes the multiplexer and wherein the multiplexer is compatible with multiple vehicles.

8. The method of claim 1, wherein the data link connector is a diagnostic port.

9. A system comprising:
one or more computer processors; and
one or more computer-readable mediums storing instructions that, when executed by the one or more computer processors, cause the system to perform operations comprising:
maintaining a vehicle data index including data identifying pinout configurations for a plurality of vehicles;
responsive to a device having been connected to a communication bus implemented within a vehicle, the device being connected to the communication bus via a data link connector that includes a set of pins for communicating with the communication bus, receiving, from the device, an identifier associated with the vehicle;
determining a pinout configuration for the device communicating with the communication bus based on the maintained vehicle data index and the identifier associated with the vehicle; and
transmitting, to the device, a response message identifying the pinout configuration for a multiplexer for communicating with the communication bus via the data link connector.

10. The system of claim 9, wherein the device includes a network gateway device, the network gateway device providing wireless communication capabilities for the device.

11. The system of claim 10, wherein the response message identifying the pinout configuration for the multiplexer for communicating with the communication bus via the data link connector is transmitted to the network gateway device.

12. The system of claim 9, wherein the identifier is a Vehicle Identification Number (VIN).

13. The system of claim 9, wherein the determining a pinout configuration for the device communicating with the communication bus based on the maintained vehicle data index and the identifier associated with the vehicle further comprises:
determining a type of vehicle based on the identifier associated with the vehicle; and
identifying, in the maintained vehicle data index, a pinout configuration associated with the determined type of vehicle.

14. The system of claim 13, wherein the type of vehicle comprises a vehicle make and a vehicle model.

15. The system of claim 9, wherein the device includes the multiplexer and wherein the multiplexer is compatible with multiple vehicles.

16. The system of claim 9, wherein the data link connector is a diagnostic port.

17. A non-transitory computer-readable medium storing instructions that, when executed by one or more computer processors of one or more computing devices, cause the one or more computing devices to perform operations comprising:
maintaining a vehicle data index including data identifying pinout configurations for a plurality of vehicles;
responsive to a device having been connected to a communication bus implemented within a vehicle, the device being connected to the communication bus via a data link connector that includes a set of pins for communicating with the communication bus, receiving, from the device, an identifier associated with the vehicle;
determining a pinout configuration for the device communicating with the communication bus based on the maintained vehicle data index and the identifier associated with the vehicle; and
transmitting, to the device, a response message identifying the pinout configuration for a multiplexer for communicating with the communication bus via the data link connector.

18. The non-transitory computer-readable medium of claim 17, wherein the identifier is a Vehicle Identification Number (VIN).

19. The non-transitory computer-readable medium of claim 17, wherein the determining a pinout configuration for the device communicating with the communication bus based on the maintained vehicle data index and the identifier associated with the vehicle further comprises:
determining a type of vehicle based on the identifier associated with the vehicle; and
identifying, in the maintained vehicle data index, a pinout configuration associated with the determined type of vehicle.

20. The non-transitory computer-readable medium of claim 19, wherein the type of vehicle comprises a vehicle make and a vehicle model.

* * * * *